United States Patent [19]

Dolby

[11] Patent Number: 4,701,722
[45] Date of Patent: Oct. 20, 1987

[54] CIRCUIT ARRANGEMENTS FOR MODIFYING DYNAMIC RANGE USING SERIES AND PARALLEL CIRCUIT TECHNIQUES

[76] Inventor: Ray M. Dolby, 3340 Jackson St., San Francisco, Calif. 94118

[21] Appl. No.: 744,965

[22] Filed: Jun. 17, 1985

[51] Int. Cl.$^4$ ............................................. H04B 1/64
[52] U.S. Cl. ....................................... 333/14; 381/106
[58] Field of Search .......................... 333/14; 330/305; 381/106; 455/72

[56] References Cited

U.S. PATENT DOCUMENTS

| 2,589,723 | 3/1952 | Miller, Jr. | 333/17 R |
| 3,902,131 | 8/1975 | Dorren | 333/14 X |
| 3,911,371 | 10/1975 | Nakamura et al. | 330/293 |
| 4,101,849 | 7/1978 | Blackmer et al. | 333/14 |
| 4,462,008 | 7/1984 | Katakura | 333/14 |
| 4,545,258 | 10/1985 | Coursolle | 330/305 X |

Primary Examiner—Paul Gensler
Attorney, Agent, or Firm—Majestic, Gallagher, Parsons & Siebert

[57] ABSTRACT

Circuits for modifying the dynamic range of signals, particularly compressors and expanders for use in noise reduction compander systems, in which the advantages of fixed band characteristics (variable attenuation throughout all or part of the frequency band) and sliding band characteristics (variable attenuation through part of the frequency band achieved by a variable pass filter) are provided, without the disadvantages normally inherent in each characteristic. Fixed band and sliding band circuit elements are operated either in parallel or in series, the elements operating in generally the same level range and at least a partial overlapping in frequency range.

10 Claims, 21 Drawing Figures

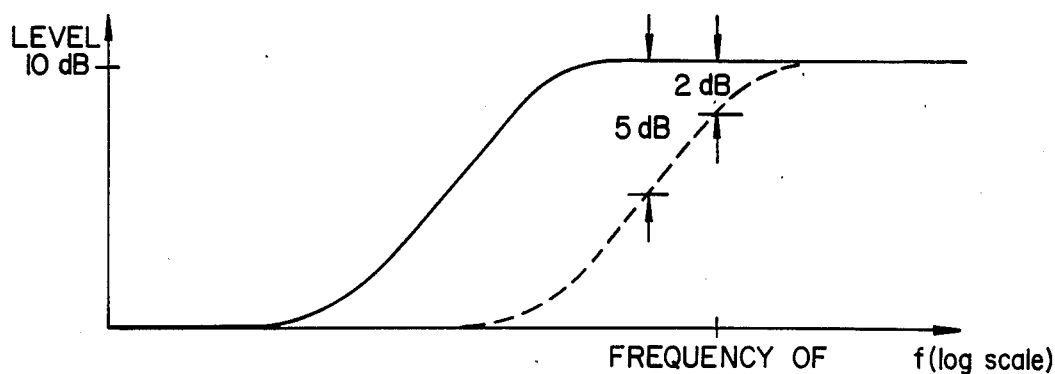
FIG._1. (PRIOR ART)
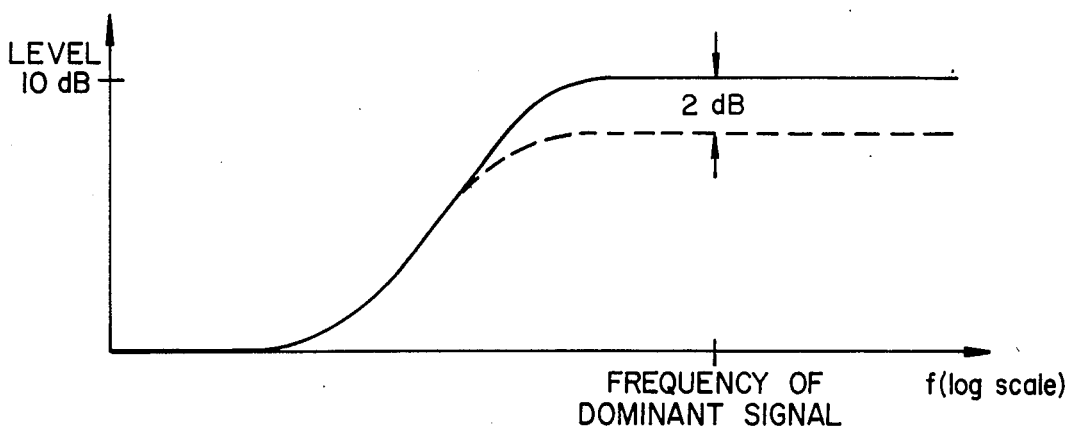
FIG._2. (PRIOR ART)
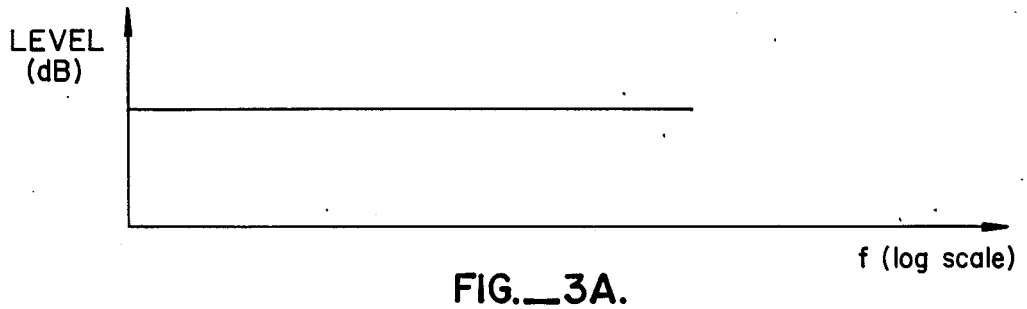
FIG._3A.
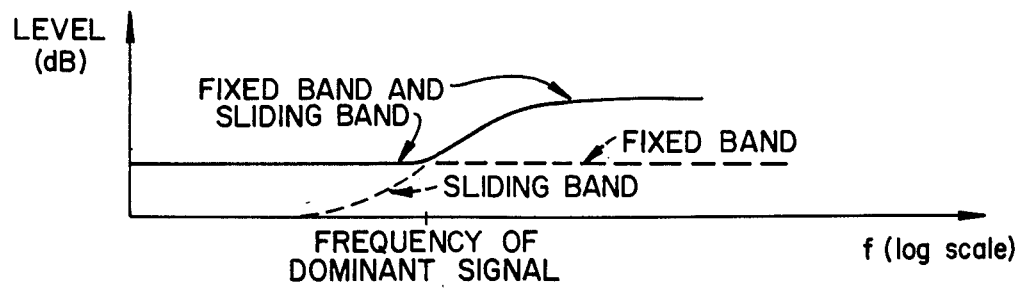
FIG._3B.

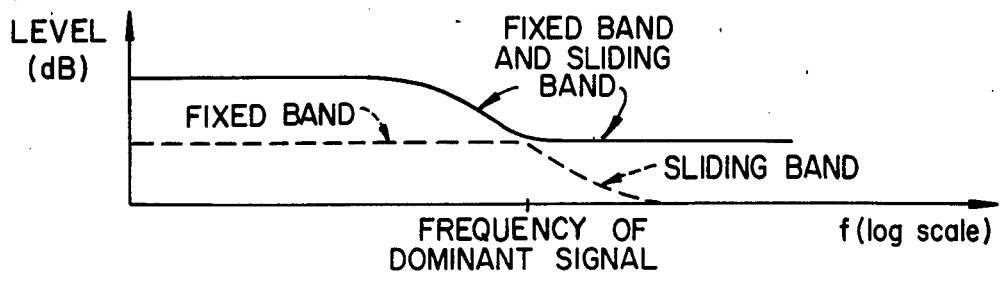
FIG._3C.
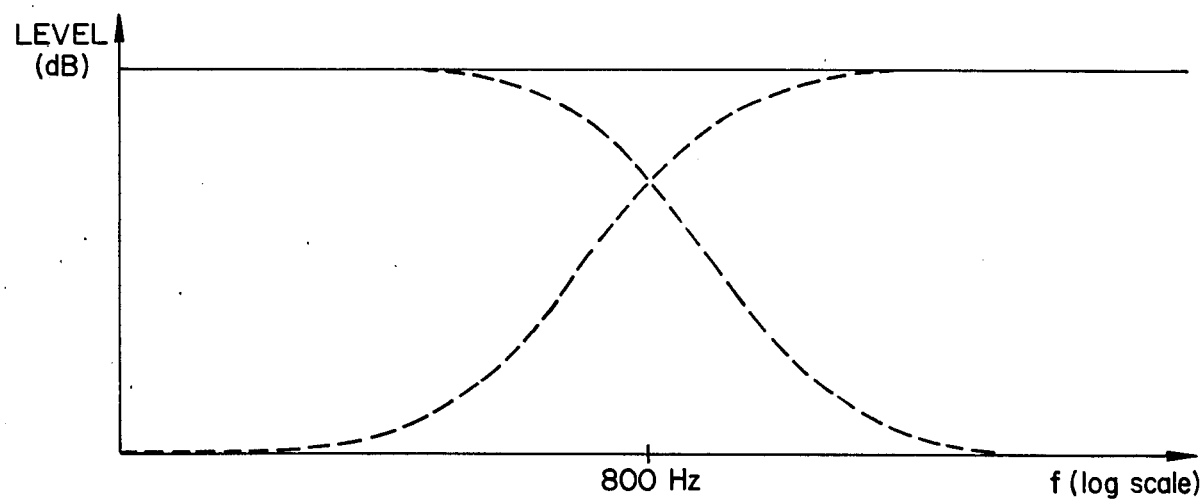
FIG._4A.
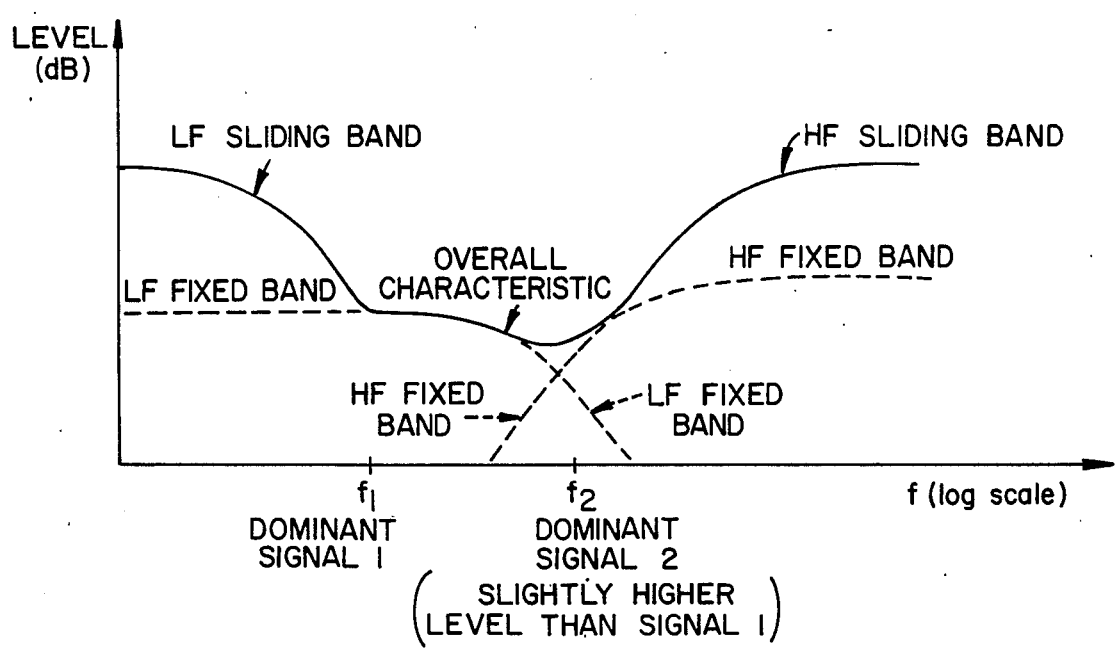
FIG._4B.

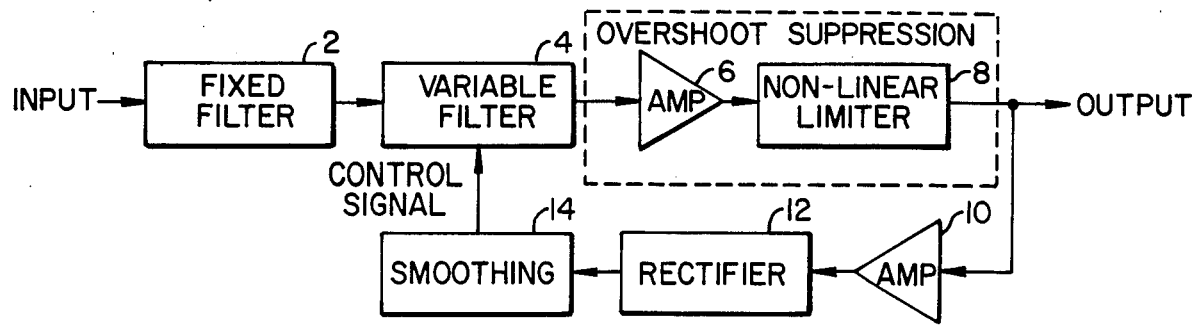
FIG._5. (PRIOR ART)
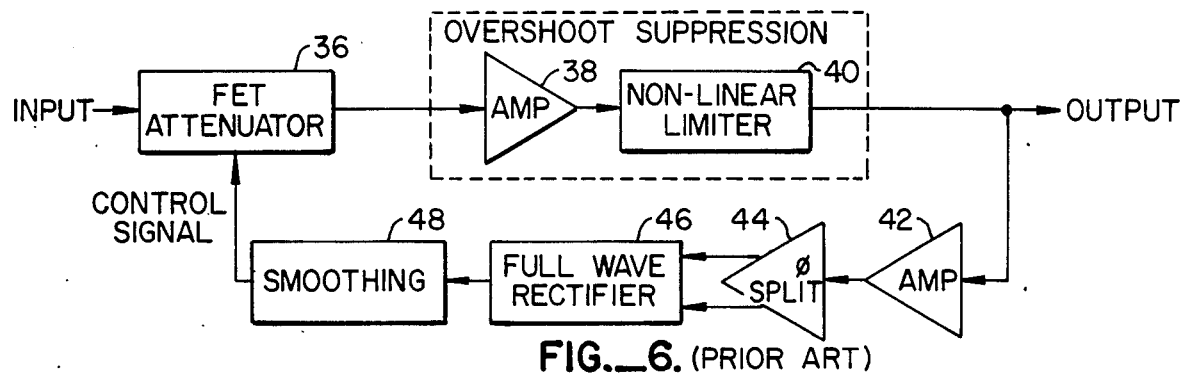
FIG._6. (PRIOR ART)
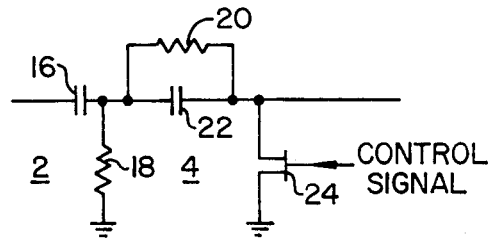
FIG._7. (PRIOR ART)
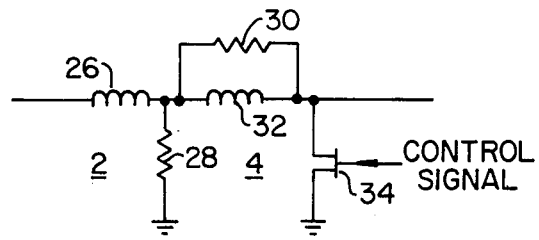
FIG._8. (PRIOR ART)
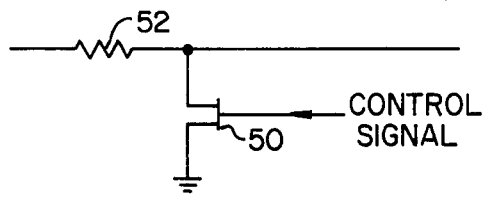
FIG._9. (PRIOR ART)

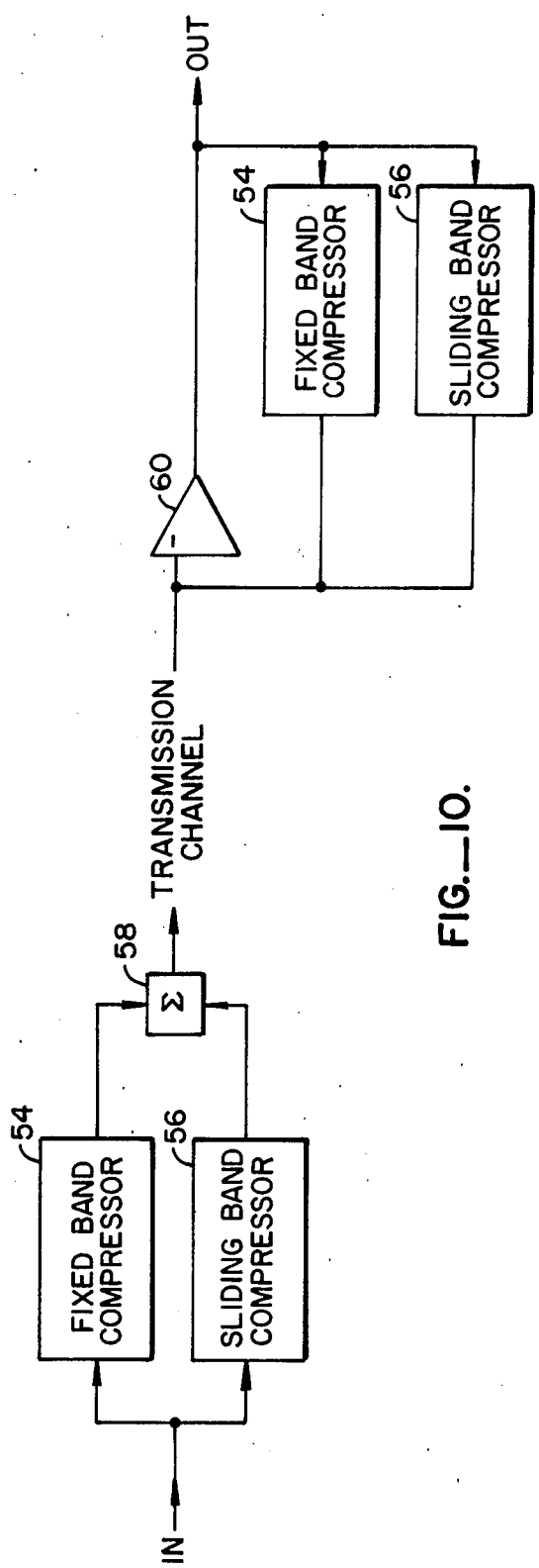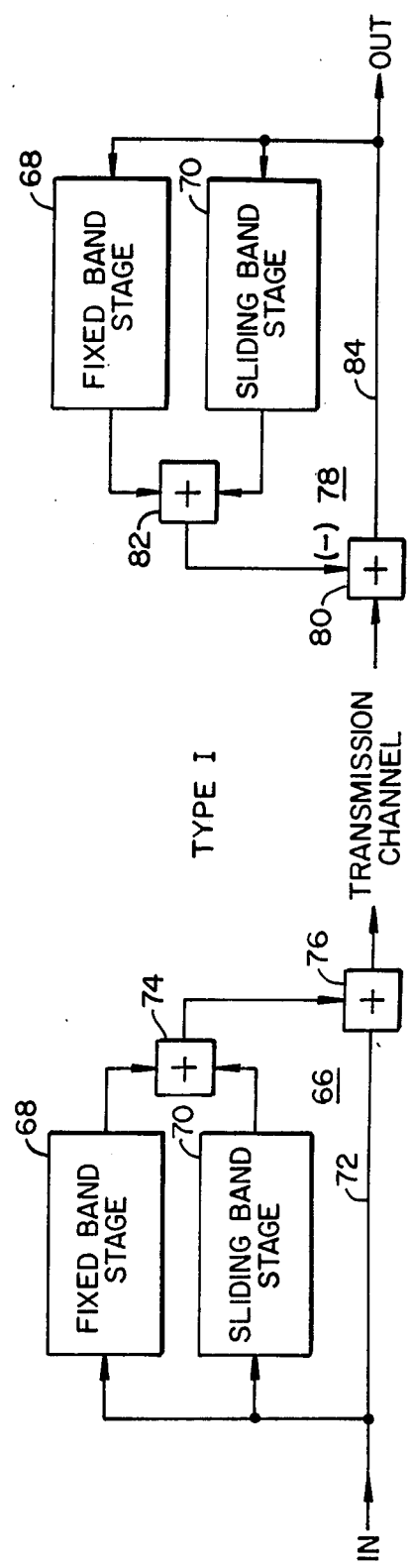
FIG._10.
FIG._11.

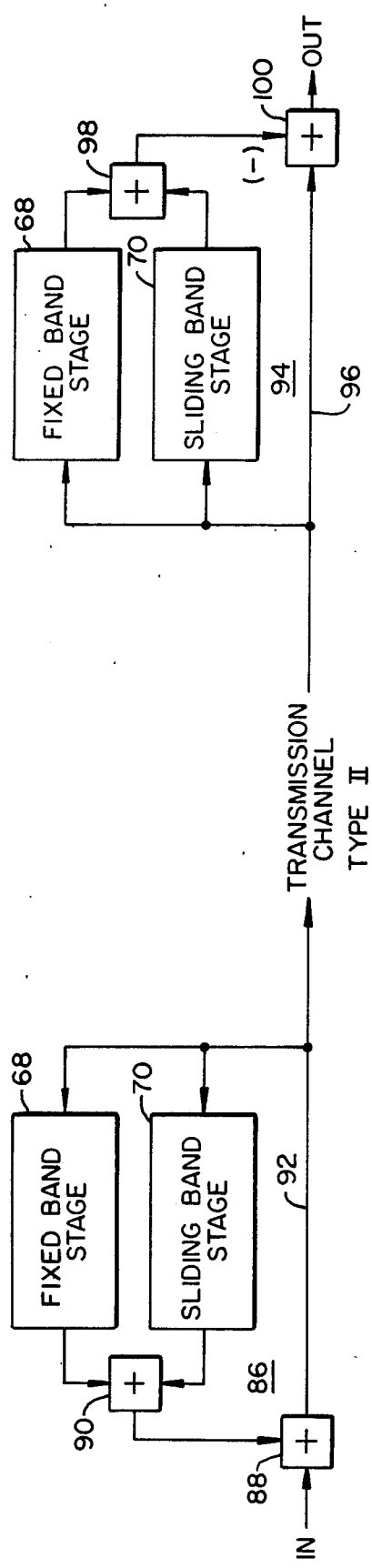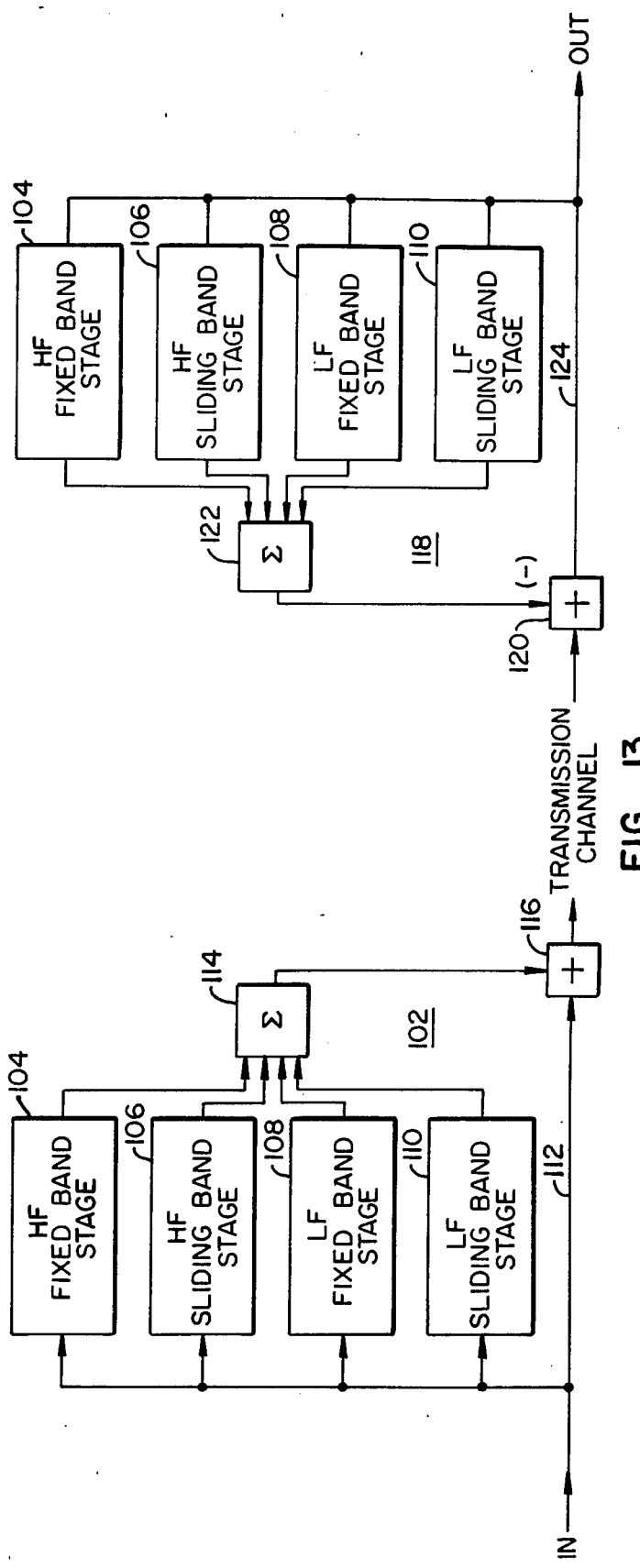
FIG._12.
FIG._13.

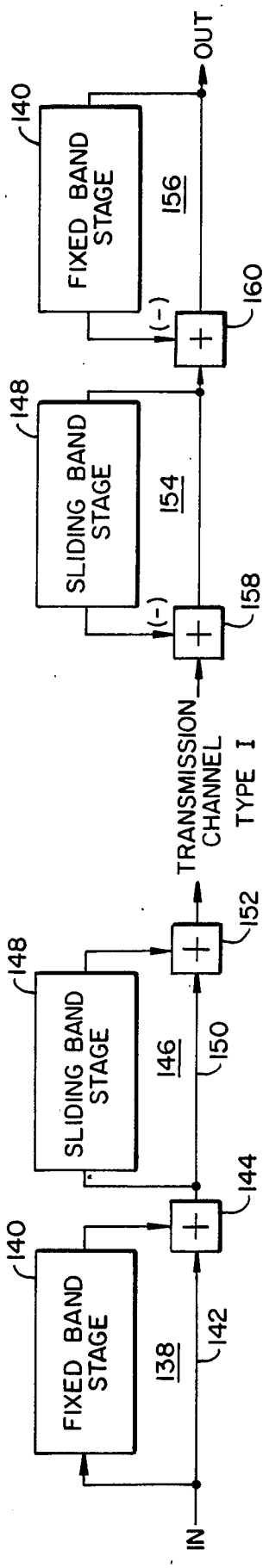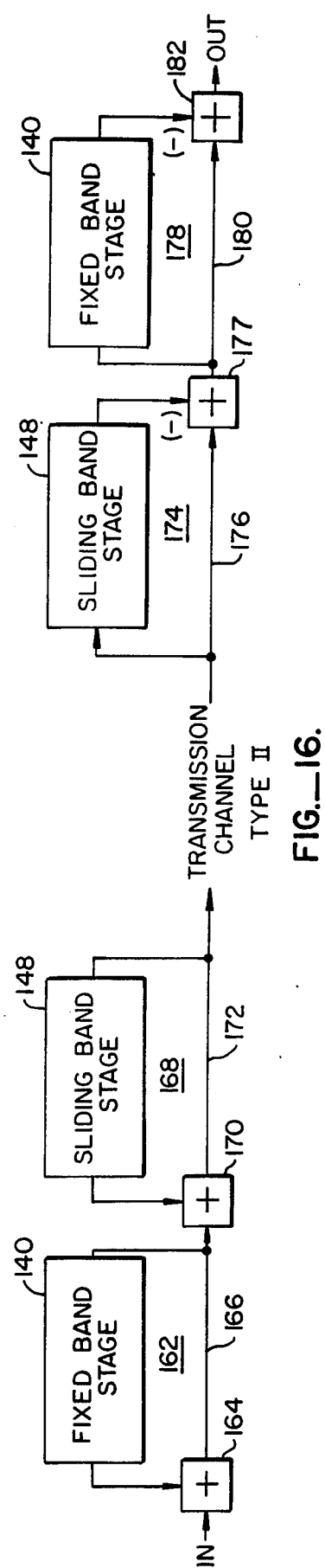

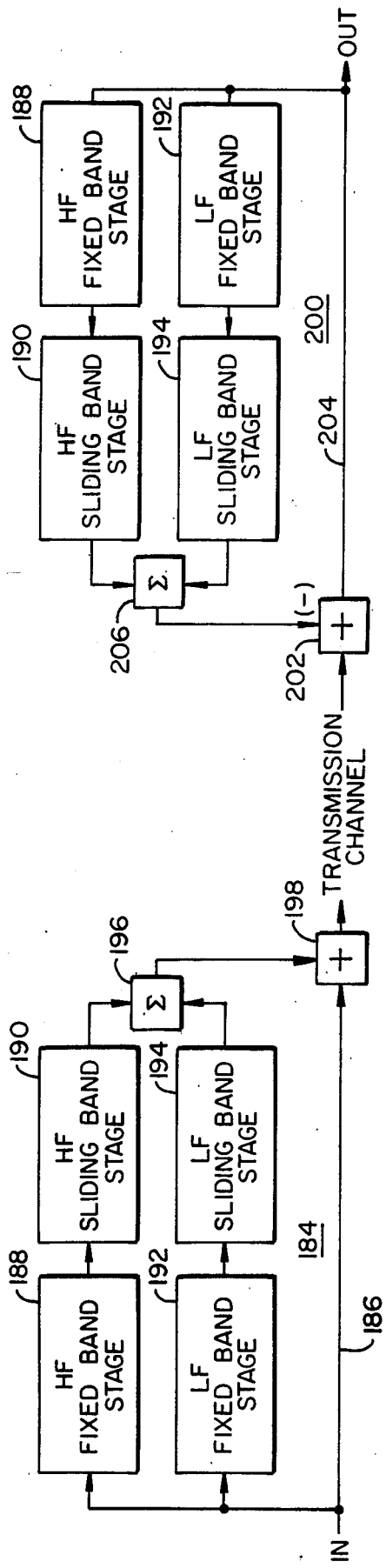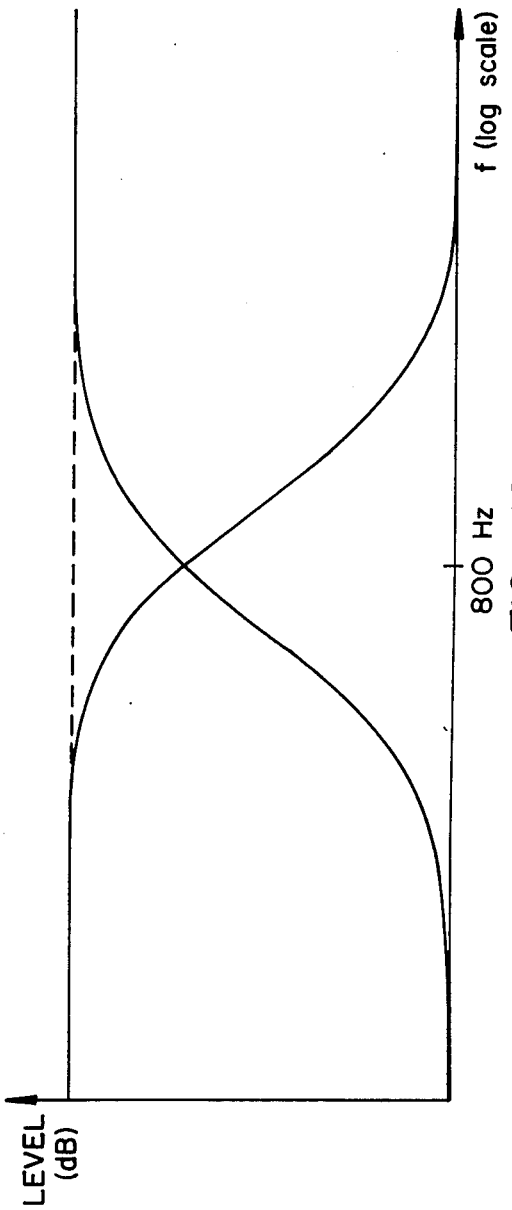

CIRCUIT ARRANGEMENTS FOR MODIFYING DYNAMIC RANGE USING SERIES AND PARALLEL CIRCUIT TECHNIQUES

BACKGROUND OF THE INVENTION

The present invention is concerned in general with circuit arrangements which alter the dynamic range of signals, namely compressors which compress the dynamic range and expanders which expand the dynamic range. While the invention is useful for treating various types of signals, including audio signals and video (television) signals, the description of the invention is primarily in the context of the processing of audio signals. The principles of the invention may be applied to the processing of other signals by modifying the disclosed embodiments by applying known techniques. For example, compressors and expanders for video signals can act instantaneously and do not require syllabic control circuitry.

Compressors and expanders are normally used together (a compander system) to effect noise reduction; the signal is compressed before transmission or recording and expanded after reception or playback from the transmission channel However, compressors may be used alone to reduce the dynamic range, e.g., to suit the capacity of a transmission channel, without subsequent expansion when the compressed signal is adequate for the end purpose. In addition, compressors alone are used in certain products, especially audio products which are intended only to transmit or record compressed broadcast or pre-recorded signals. Expanders alone are used in certain products, especially audio products which are intended only to receive or play back already compressed broadcast or pre-recorded signals. In certain products, a single device is often configured for switchable mode operation as a compressor to record signals and as an expander to play back compressed broadcast or pre-recorded signals.

One long sought after goal in the design of compressors, expanders and companding type noise reduction systems is a high degree of adaptiveness of the compressor and expander to applied signals. That is, the compressor, for example, ideally should provide constant gain throughout its frequency spectrum of operation except at the frequency of a dominant signal component where it would provide dynamic action according to a predetermined compression law. This goal was referred to as "conformal equalization" in U.K. Provisional Specification No. 43136 filed Oct. 11, 1965 by this inventor. Accordingly, that document (along with two other U.K. Provisional Specifications of this inventor, Nos. 34394 and 02368, filed Aug. 11, 1965 and Jan. 18, 1966, respectively) and subsequent patents derived therefrom (including U.S. Pat. Nos. 3,846,719 and 3,903,485) employed several techniques directed to achieving that goal, including, among others, techniques now commonly known as "bandsplitting" and "sliding band".

According to the bandsplitting approach, the spectrum is divided into a plurality of frequency bands, each of which is acted upon independently. In that way a dominant signal component affects dynamic action (compression or expansion) only within a portion of the overall spectrum, in contrast to a wideband approach in which dynamic action throughout the entire spectrum is affected by a dominant signal component. Thus, a bandsplitting system provides a greater degree of adaptiveness or conformance than a wideband system. In theory, a highly adaptive or conformal system could be provided by dividing the overall spectrum into a very large number of frequency bands; however, the complexity and cost of such an arrangement makes it impractical. Consequently, a design compromise is made by selecting a reasonable number of frequency bands capable of providing satisfactory performance. In one well known commercially successful bandsplitting companding type audio noise reduction system (commonly known as A-type noise reduction) four bands are employed ("An Audio Noise Reduction System", by Ray Dolby, J. Audio Eng. Soc., October 1967, Vol. 15, No. 4, pp. 383-388). However, such systems suffer from the same problems as does a wideband noise reduction system, although to a lesser degree because the band is divided up and the problems tend to be confined to the individual bands. These problems are well known in the design of noise reduction systems and include loss of noise reduction effect and the related problems of noise modulation and signal modulation at frequencies not masked by the dominant signal component when a change of gain takes place in response to a dominant signal component. Such problems are chiefly a result of a system failing to be perfectly conformant to the dominant signal. The degree to which such problems are audible also depends on how far the system departs from perfect complementarity. If, for example, the transmission channel response is irregular or unpredictable within the passband of the compressor and expander, then signal modulation effects will not be compensated in the expander.

A dominant signal component is a signal component having a substantial enough level so as to effect dynamic action within the frequency band under consideration. Under complex signal conditions there may be more than one dominant signal component or a dominant signal component and sub-dominant signal components. In a compander system which relies on complementarity of the compressor and expander, all of the signal components must be compressed and expanded in accordance with a defined compression/expansion law in order that the signal spectrum including the dominant signal component (and other signals affected by dynamic action) can be restored to their correct levels in the expander. This requirement excludes the usefulness in compander systems of various known adaptive and tracking filter techniques and so-called "single ended" noise reduction systems (which operate only on a reproduced signal) in which the filter action is not subject to predetermined compression/expansion laws and whose action may be unpredictable in the presence of multiple signals.

Another approach useful in working toward the goal of increased adaptiveness or conformance is the sliding band technique, which employs signal dependent variable filtering to achieve limiting. Generally, a dominant signal component causes the cutoff or turnover frequency (or frequencies) of one or more variable filters (e.g., high pass, low pass, shelf, notch, etc.) to shift so as to compress or expand the dominant signal component.

A sliding band system operating only in a single high frequency band is described in U.S. Pat. Re No. 28,426 and U.S. Pat. No. 4,490,691. This system, which forms the basis for the well known consumer companding type audio noise reduction system known as B-type noise reduction, includes, in a dual path arrangement, a side path having a fixed high pass filter in series with a variable filter.

A "dual path" arrangement is one in which a compression or expansion characteristic is achieved through the use of a main path which is essentially free of dynamic action and one or more secondary or side paths having dynamic action. The side path or paths take their input from the input or output of the main path and their output or outputs are additively or subtractively combined with the main path in order to provide compression or expansion. Generally, a side path provides a type of limiting or variable attenuation and the manner in which it is connected to the main path determines if it boosts (to provide compression) or bucks (to provide expansion) the main path signal components. Such dual path arrangements are described in detail in U.S. Pat. Nos. 3,846,719; 3,903,485; 4,490,691 and U.S. Pat. Re No. 28,426.

A high frequency variable shelving filter in a single path arrangement (e.g., the dynamic action is accomplished in a single signal path) for a companding audio noise reduction system is set forth in U.S. Pat. No. 3,911,371. In the embodiments of FIGS. 1 and 2 of U.S. Pat. No. 3,665,345 a dual path arrangement is set forth in which the side path comprises a variable shelving filter having an all-pass characteristic in its quiescent condition. Another approach for providing a variable shelving response for compander systems is set forth in U.S. Pat. No. 3,934,190.

One drawback of these sliding band arrangements is that in the presence of a dominant high frequency signal component the variable filter turnover frequency shifts to a frequency above that signal component thereby restricting the frequency area at lower frequencies in which noise reduction is provided. The loss of noise reduction may be more noticeable audibly than in band-splitting systems and the related side effects (noise modulation and signal modulation) may be more severe than in fixed band arrangements because of a multiplication effect that is inherent in sliding band systems. This effect results from the way in which sliding band systems provide compression. If, for example, there is a dominant high frequency signal and 2 dB of gain reduction is required at that frequency, the variable filter cutoff frequency should shift to the extent necessary to provide that amount of attenuation along the filter slope. However, for lower frequencies, further removed from the new filter cutoff frequency, the effect may be 5 or 10 dB of dynamic action, for example, with a consequent loss of all or most of the noise reduction effect along with possible audible signal or noise modulation. In other words, in this example, a 2 dB change in a dominant signal can cause a 5 or 10 dB change in gain at frequencies removed from the dominant signal. FIG. 1 illustrates this effect. This problem is called the "mid-band modulation effect", which occurs under relatively rare conditions when very high frequency dominant signal components (cymbals, for example) control the sliding band filter. There may be audible modulation of non-dominant mid-band signal components that are also present if the expander does not properly track the compressor. One approach in solving the problem is set forth in said U.S. Pat. No. 4,490,691.

In a fixed band arrangement the same amount of gain reduction would occur throughout the frequency band (whether wide band or one frequency band of a band-splitting system) in response to a dominant signal component. Thus, while signal or noise modulation may occur, there is no multiplication of the effect a 2 dB change in the level of a dominant signal component would cause a 2 dB change in gain at frequencies removed from the dominant signal component. However, viewed from the standpoint of noise reduction effect this is a disadvantage of a fixed band arrangement—the full noise reduction effect is not obtained anywhere within the frequency band of operation when limiting occurs in response to a dominant signal component. FIG. 2 illustrates this effect. Although it is not multiplied, there is also the potential for noise and signal modulation throughout the entire frequency band in which the fixed band action occurs.

Despite the disadvantages mentioned, an advantage of a sliding band arrangement is that the full noise reduction effect is obtained at frequencies above the dominant signal component (or below the dominant signal component in the case of a sliding band system acting downard in frequency). Thus an arrangement that achieves the advantages of fixed band and sliding band systems (e.g., the advantage of fixed band is that there is no multiplication of modulation effects and the advantge of sliding is that there is minimum signal or noise modulation the dominant signal frequency) without the disadvantages of each (e.g., the disadvantage of fixed band is noise and signal modulation throughout its operating range—although not multiplied and the disadvantage of sliding band is the mid-band modulation effect) would be desirable.

Although it is known to employ fixed band and sliding band actions in separate frequency bands of bandspltting arrangements and to employ more than one dynamic action within the same frequency band, prior art arrangements have not obtained the above noted advantages of fixed band and sliding band action by employing those actions simultaneously in substantially the same frequency band.

SUMMARY OF THE INVENTION

The present invention is based on the recognition that the ideal of conformal equalization can be more closely approached by compressor, expander and compander type noise reduction arrangements in which fixed band and sliding band characteristic actions operate within generally the same or overlapping frequency bands. In practice, such a result can be achieved by operating fixed band and sliding band circuit elements in parallel, either as parallel single path devices or as parallel side paths of a dual path arrangement. Such a result can also be achieved by operating such elements in a series arrangement, provided that relatively low compression ratios are used, so that the overall ratio (the product) does not exceed a value suitable for the signal channel. For example, two series elements, each with a ratio of 1.5:1, would yield an overall ratio of 2.25, which is suitable for tape recorder channels. So that the effects of the series connected compressor elements occur in substantially the same dynamic region, the control amplifier gains should be lowered and/or the thresholds of the downstream elements should be raised in order to compensate for the signal gains produced by the upstream elements.

By applying the teachings of the present invention the advantages of both fixed band and sliding band characteristic actions can be obtained while avoiding their disadvantages. Thus, if a sliding band characteristic and a fixed band characteristic are operable in substantially the same frequency range (wide band or a defined band) and level range, the quiescent characteristic of the combination appears the same as the quiescent characteristic of either one taken alone because the two quiescent characteristics are the same. When a dominant signal component appears within their frequency range each characteristic reacts—the fixed band characteristic drops uniformly in level across the frequency range and the sliding band characteristic slides in frequency.

As these changes occur, the two characteristics, which appeared as one characteristic in the quiescent condition (FIG. 3A), are now revealed: the combined characteristic appears as that of a sliding band characteristic above (or below, depending on whether the sliding band acts upwardly or downwardly in frequency) the frequency of the dominant signal and it appears as a fixed band characteristic below (or above) the frequency of the dominant signal. FIG. 3B shows an example in which the sliding band is above the dominant signal and FIG. 3C shows an example in which the sliding band is below the dominant signal. Two regimes of operation are revealed, divided at the frequency of the dominant signal. Thus, the region which the sliding band characteristic would have left "uncovered" is supplemented by the fixed band characteristic which, in effect, provides a floor or foundation level. The result is to obtain the advantages of both fixed band and sliding band arrangements while avoiding their disadvantages. Maxium noise reduction effect and minimum modulation effects are obtained above (or below) the dominant signal where the sliding band characteristic operates while avoiding the loss of noise reduction and the creation of signal modulation and noise modulation effects below (or above) the dominant signal by the presence of the fixed band characteristic. Thus, there is no multiplication effect below (or above) the dominant frequency as would occur if the sliding band characteristic were operating alone, while obtaining the advantages of the sliding band characteristic above (or below) the dominant frequency.

The characteristics of the example of FIGS. 3A, 3B and 3C, can be generated by a dual path arrangement having a main path and two side paths: a sliding band side path which has an all pass quiescent characteristic with a single pole high pass or low pass characteristic when active and a wide band fixed band side path. If each side path taken alone is assumed to provide 10 dB of action, then the effect of both side paths summed together is about 14.5 dB. The quiescent characteristic is thus a flat 14.5 dB wideband. Similar characteristics can be generated by two single side path dual path circuits in series, one circuit having a sliding band side path as just described and the other circuit having a wide band fixed band side path. As a dominant signal appears in either the parallel or series arrangement and the two characteristics react, the area where both characteristics are active (e.g., that area where the sliding band is active) will have a summed characteristic less than the maxium when both characteristics are at their full values (although the sliding band characteristic remains at the 10 dB level where it is effective, the fixed band has attenuated throughout the entire range, thus their sum is less than the former maximum). Note that if two single path parallel elements had been used, the total potential excess effect would be 6 dB instead of only 4.5 dB as in the dual path example. This is a further advantage of dual path circuits over and above those already known.

An even more adaptive arrangement can be achieved according to this invention by providing a band-splitting arrangement in which the high frequency band and low frequency band are each comprised of series or parallel fixed band/sliding band characteristic action elements. In the high frequency band the sliding band acts upwardly in frequency while in the low frequency band the sliding band acts downwardly in frequency. In the quiescent condition the characteristics overlap so as to provide a flat overall characteristic. By choosing gentle filter slopes (say, 6 dB/octave) and a common quiescent corner frequency in the middle of the frequency band (say, 800 Hz for an audio system), excellent tracking of a dominant signal by both the high and low frequency bands throughout a substantial portion of the band under processing is possible. The quiescent response of such an arrangement is shown in FIG. 4A. The presence of two dominant signals results in a fixed band response between the dominant signals and sliding band response at frequencies above and below their frequencies where maximum noise reduction is most critical (FIG. 4B).

BRIEF DESCRIPTION OF THE DRAWINGS

FIG. 1 is an idealized characteristic response curve illustrating the prior art sliding band multiplication effect.

FIG. 2 is an idealized characteristic response curve illustrating the prior art fixed band limiting effect.

FIG. 3A is an idealized characteristic response curve showing the quiescent response of fixed band and sliding band elements in parallel in accordance with the invention.

FIG. 3B is an idealized characteristic response curve showing the response slightly above their thresholds of fixed band and sliding band elements in parallel in accordance with the invention, the sliding band acting upward in frequency.

FIG. 3C is an idealized characteristic response curve showing the response slightly above their thresholds of fixed band and sliding band elements in parallel in accordance with the invention, the sliding band acting downward in frequency.

FIG. 4A is an idealized characteristic response curve showing the quiescent response of high frequency and low frequency circuits, each having fixed band and sliding band elements in parallel in accordance with the invention, the circuits having a common corner frequency of 800 Hz.

FIG. 4B is an idealized characteristic response curve showing the response in the presence of two dominant signals of the same high frequency and low frequency circuits referred to in connection with FIG. 4A.

FIG. 5 is a block diagram of a prior art sliding band circuit.

FIG. 6 is a block diagram of a prior art fixed band circuit.

FIG. 7 is a schematic diagram of filters usable in the circuit of FIG. 5.

FIG. 8 is a schematic diagram of further filters usable in the circuit of FIG. 5.

FIG. 9 is a schematic diagram of an FET attenuator usable in the circuit of FIG. 6.

FIG. 10 is a block diagram showing generally the present invention embodied in a companding noise reduction system having parallel fixed band and sliding band elements.

FIG. 11 is a block diagram showing a Type I dual path arrangement employing parallel fixed band and sliding band stages of the type described in connection with FIGS. 5 through 9.

FIG. 12 is a block diagram showing a Type II dual path arrangement employing parallel fixed band and sliding band stages of the type described in connection with FIGS. 5 through 9.

FIG. 13 is a block diagram showing a Type I dual path arrangement employing parallel high frequency and low frequency fixed band and sliding band stages of the type described in connection with FIGS. 5 through 9.

FIG. 14 is a block diagram showing generally the present invention embodied in a companding noise reduction system having series-fixed band and sliding band elements.

FIG. 15 is a block diagram showing a Type I dual path arrangement employing series fixed band and sliding band stages of the type described in connection with FIGS. 5 through 9.

FIG. 16 is a block diagram showing a Type II dual path arrangement employing series fixed band and sliding band stages of the type described in connection with FIGS. 5 through 9.

FIG. 17 is a block diagram showing a Type I dual path arrangement employing parallel high frequency and low frequency side paths each with fixed band and sliding band stages of the type described in connection with FIGS. 5 through 9.

FIG. 18 is a characteristic response curve relating to the arrangements of FIGS. 13 and 17.

DETAILED DESCRIPTION OF THE INVENTION

Sliding band and fixed band circuits suitable for use in compressors and expanders are well known, per se, in the art. FIG. 5 shows a block diagram of a prior art sliding band circuit for processing audio signals which is usable in several ways: as a single path compressor (as shown), as a single path expander (by placing the circuit in the feed-back loop of an operational amplifier), as a side path of a dual path compressor, or as a side path of a dual path expander. Circuit details of a high frequency sliding band arrangement in accordance with the block diagram of FIG. 5 are set forth in U.S. Pat. Re No. 28,426; U.S. Pat. Nos. 4,490,691; and 4,498,060, each of which is incorporated by reference herein.

FIG. 6 shows a block diagram of a prior art fixed band circuit for processing audio signals which is usable in the same ways as a compressor or expander either in a single path arrangement or in a side path of a dual path arrangement. Circuit details of fixed band arrangements in accordance with the block diagram of FIG. 6 are set forth in U.S. Pat. Nos. 3,846,719; 3,903,485; and 4,498,060, each of which is incorporated by reference herein.

The sliding band and fixed band circuit elements useful in the present invention are not limited to the processing of audio signals and include not only circuits of the type just mentioned, but also known modifications of such circuits, such as set forth in U.S. Pat. No. 4,490,691, and other known sliding band and fixed band circuits and their equivalents, including, for example, the sliding band arrangements of U.S. Pat. Nos. 3,846,719; 3,903,485; 3,911,371; 3,934,190; 4,306,201; 4,363,006; 4,363,007, and the fixed band arrangements of U.S. Pat. Nos. 4,306,201 and 4,363,007, each of which is incorporated by reference herein. The cited patent specifications include details regarding the operation of such circuits as compressors and expanders in dual path arrangements and the operation of compressors as complementary expanders by placing them in the feedback loop of operational amplifiers.

Referring to FIG. 5, the sliding band circuit is shown having a fixed filter 2, a variable filter 4, an amplifier 6 the output of which is coupled to a nonlinear limiter 8 for suppressing overshoots. The output of the overshoot suppression stage provides the circuit output and is also applied to a control circuit having an amplifier 10 the output of which is applied to a half-wave rectifier 12 and integrated by a smoothing filter 14 to provide a control signal for the variable filter 4. The fixed filter 2 may be implemented by a simple single pole RC filter. The variable filter 4 may also be implemented by a simple single pole RC filter in which the source-drain path of a field effect transistor (FET) is operated as a variable resistor by a control voltage applied to the FET gate.

FIG. 7 shows a fixed and variable filter arrangement for a high frequency sliding band circuit in which the cutoff frequency of the variable filter 4 moves upward in response to increasing control signal voltage level. FIG. 8 shows a fixed and variable filter arrangement for a low frequency sliding band circuit in which the cutoff frequency of the variable filter 4 moves downward in response to increasing control signal voltage level. In FIG. 7, the fixed filter 2 is defined by series capacitor 16 and shunt resistor 18 and the variable filter 4 is defined by the parallel arrangement of resistor 20 and capacitor 22 in series and the shunt FET 24 receiving the control signal at its gate. Capacitor 16 and resistor 18 constitute a high pass filter, while resistor 20, capacitor 22 and FET 24 constitute a high pass shelving filter. Although resistor 20 can be omitted (changing variable filter 4 into a variable high pass filter), the inclusion of resistor 20 is useful in avoiding large phase shifts through the filters. In FIG. 8, the fixed filter 2 is defined by series inductor 26 and shunt resistor 28 and the variable filter 4 is defined by the parallel arrangement of resistor 30 and inductor 32 in series and the shunt FET 24 receiving the control signal at its base. Inductor 26 and resistor 28 constitute a low pass filter, while resistor 30, inductor 32 and FET 24 constitute a low pass shelving filter. Resistor 30 serves the same purpose as does resistor 20 in the circuit of FIG. 7. In practice, inductor 26 and resistor 28 would be replaced by a series resistor and shunt capacitor; non-grounded inductor 32 can be simulated by well known gyrator circuits employing operational amplifiers.

In the arrangements of FIGS. 7 and 8, under quiescent conditions the FET is pinched off and the variable filter 4 becomes an all pass filter, the fixed filter 2 thus determines the frequency response of the circuit. Under signal conditions as the FET begins to conduct, the variable filter corner frequency rises and when it is above the corner frequency of the fixed filter it determines the frequency response of the circuit. The fixed filter 2 of the arrangements of FIGS. 5, 6, 7 and 8 can be omitted if desired, however, the additional sharpness of the overall filter characteristic that occurs when the variable filter corner frequency is near that of the fixed filter is a desirable characteristic.

Returning to the description of FIG. 5, the amplifier 10 preferably includes frequency weighting in order to provide increased gain at high frequencies, in the case of a high frequency circuit, or at low frequencies, in the case of a low frequency circuit, in order that the circuit provides sufficient band narrowing (by sliding of the variable filter corner frequency) so as to create the necessary attenuation. The smoothing filter 14 provides the appropriate attack and decay time constants for treating audio signals (e.g., syllabic control).

Referring now to FIG. 6, the fixed band circuit is shown having a FET attenuator 36, an amplifier 38 the output of which is coupled to a non-linear limiter 40 for suppressing overshoots. Amplifier 38 and limiter 40 are the same as amplifier 6 and limiter 8 of FIG. 5. The output of the overshoot suppression stage provides the circuit output and is also applied to a control circuit having an amplifier 42 the output of which is applied to a phase splitter 44 which drives a full-wave rectifier 46 and is integrated by a smoothing filter 48. Full-wave rectification may also be employed in the sliding band arrangement of FIG. 5 and alternatively, the half-wave rectification of FIG. 5 may be employed in the fixed band arrangement of FIG. 6. Full-wave rectification provides a more accurate control signal but at greater expense. The FET attenuator is configured as a simple voltage divider as shown in FIG. 9. The source-drain path of the FET acts as a variable resistor in shunt with series resistor 52. The circuit thus provides wide band variable attenuation. By placing a band defining filter in series with the input before the FET attenuator 36 of FIG. 6, the fixed band is effective only within the frequency band defined by the filter.

FIG. 10 shows one general arrangement of a compander system in accordance with the parallel aspect of the invention: a fixed band compressor 54 and a sliding band compressor 56 are connected in parallel, each receiving the same input and their respective outputs being combined in summing means 58 for application to a transmission channel. The transmission channel output is applied to a complementary fixed band expander 60 and a complementary sliding band expander 62, connected in parallel, each receiving the same input and their outputs being combined in summing means 64 to provide the system output. The frequency bands in which the respective fixed band and sliding band compressors and expanders operate is substantially the same or at least substantially overlapping. The range of signal levels at which the respective fixed band and sliding band compressors and expanders provide dynamic action is substantially the same; within a few decibels. The compressors and complementary expanders may be any of the devices mentioned above.

The voltage transfer function for a parallel arrangement of compressor or expander elements (e.g., the elements are fed in parallel and their outputs are summed) can be expressed by $$V_{out} = V_{in}[t_1(s) + t_2(s) + t_3(s) + \ldots],$$

where $V_{in}$ is the applied voltage, $V_{out}$ is the output voltage, and $t_1(s)$, $t_2(s)$, etc. are the transfer functions of each parallel element. The transfer functions add together and each element operates independently.

A more specific arrangement is shown in FIG. 11, where the fixed band and sliding band circuits, such as those described in connection with FIGS. 5 through 9, are located in the side paths of a Type I dual path compander system (of the type generally described in U.S. Pat. No. 3,846,719). The arrangement has a compressor 66 in which the input signal is applied to the fixed band stage 68, to the sliding band stage 70, and to the main path 72. The outputs of stages 68 and 70 are combined in summing means 74 and then added to the main path signal components in summing means 76 to provide the compressor output for appliation to a transmission channel. The side path signal components thus boost the main path signal components causing compressor action. The transmission channel output is applied to the expander 78, configured in a complementary manner to the compressor 6. The expander 78 has an input summing means 80 which receives the transmission channel output and subtracts the sum of the fixed band stage 68 and the sliding band stage 70 outputs, which are added in suming means 82. The side path signal components thus buk the main path signal components causing expander action. The summing means 80 has its output applied to the ain path 84 which provides the expander output and the input to the stages 68 and 70.

In FIG. 12, a Type II dual path arrangement (of the type generally described in U.S. Pat. No. 3,903,485) is shown having a compressor 86 which has an input summing means 88 receiving the input signal and the sum of the fixed band stage 68 and sliding band state 70 outputs, which are combined in summing means 90. The summing means 88 has its output applied to the main path 92 which provides the compressor output to the transmission channel and the input to the stages 68 and 70 of the compressor. The side path signal components thus boost the main path signal components causing compressor action. The transmission channel output is applied to the expander 94, configured in a complementary manner to the compressor 86. The input signal is applied to the fixed band stage 68 and the sliding band stage 70 and to the main path 96. The outputs of stages 68 and 70 are summed in summing means 98 and then subtracted from the main path signal components in summing means 100 to provide the expander output. The side path signal components thus buck the main path signal components causing expander action.

As mentioned above, a very useful arrangement is to provide a compressor or expander configured in the nature of bandsplitting high frequency and low frequency bands, each band made up of parallel sliding band and fixed band stages (e.g., a high frequency fixed band stage or element, a high frequency sliding band stage, a low frequency fixed band stage, and a low frequency sliding band stage). The parallel stages can operate as stand alone dynamic range modification devices or as side paths in Type I or Type II dual path arrangements such as described in U.S. Pat. Nos. 3,846,719; 3,903,485; U.S. Pat. Re Pat. No. 28,426; and U.S. Pat. No. 4,490,691. Preferably, single pole filters with the same corner frequency in each are employed so that tne combined quiescent response of the four stages is flat. An advantageous corner frequency for the high and low frequency stages is about 800 Hz for an audio system. With the gently sloping 6 dB/octave slope of the filters, if the high frequency stages have a corner frequency of 800 Hz, significant action as low as 100 or 200 Hz is provided. If the low frequency stage also has a corner frequency of 800 Hz, significant action as high as 6 kHz to 8 kHz is provided. Thus, for signals lying in the range of, say 200 Hz to 6 kHz, which is the band having most of the energy in typical music, the high and low frequency stages are effective and provide a signal tracking effect. For example, as explained further below, for a single dominant signal in that range, the overall response is that of two sliding bands, above and below the dominant signal. For more than one dominant signal the response is a fixed band between the most upper and most lower dominant signals and sliding band responses above and below the most upper and most lower dominant signals, respectively.

FIG. 13 shows a bandsplitting arrangement of the type just described. The sliding band stages may be implemented using any of the circuits discussed above. The same corner frequency preferably is used for all of the fixed band and sliding band stages the quiescent corner frequency in the case of the sliding band stages). The high frequency sliding band stages should operate such that their corner frequency slides upward from the quiescent frequency as signal levels rise. The low frequency sliding band stages should operate such that their corner frequency slides downward from the quiescent frequency as signal levels rise. Although the arrangement of FIG. 13 is shown as a Type I compander, a Type II configuration may also be used. The arrangement has a compressor 102 in which the input signal is applied to the high frequency fixed band stage 104, to the high frequency sliding band stage 106, to the low frequency fixed band stage 108, to the low frequency sliding band stage 110, and to the main path 112. The outputs of stages 104, 106, 108, and 110 are combined in summing means 114 and then added to the main path signal components in summing means 116 to provide the compressor output for application to a transmission channel. The side path signal components thus boost the main path signal components causing compressor action. The transmission channel output is applied to the expander 118, configured in a complementary manner to the compressor 102, which has an input summing means 120 which receives the transmission channel output and subtracts the sum of the high frequency fixed band stage 104, the high frequency sliding band stage 106, the low frequency fixed band stage 108, and the low frequency sliding band stage 110 outputs, which are combined in summing means 122. The side path signal components thus buck tne main path signal components causing expander action. The summing means 120 has its output applied to the main path 124 which provides the expander output and the input to the stages 104, 106, 108, and 110.

FIG. 14 shows one general arrangment of a compander system in accordance with the series aspect of the invention: a fixed band compresor 130 and a sliding band compressor 132 are connectd in series, the fixed band compressor receiving the input and the overall compressor output being taken from the sliding band compressor 132 for application to a transmission channel. The transmission channel output is applied to a complementary sliding band expander 13 in series with a complementary fixed band expander 136. The system output is taken from the output or expander 136. The frequency bands in which the respective fixed band and sliding band compressors and expanders operate is substantially the same or at least substantially overlapping. The range of signal levels at which the respective fixed band and sliding band compressors and expanders provide dynamic action is substantially the same; within a few decibels. The compressor and complementary expanders may be any of the devices mentioned above.

The voltage transfer function for a series arrangement of compressor or expander elements can be expressed by $$V_{out} = V_{in}[t_1(s)t_2(s)t_3(s)...],$$

where $V_{in}$ is the applied voltage, $V_{out}$ is the output voltage, and $t_1(s)$, $t_2(s)$, etc. are the transfer functions of each series element. The transfer functions multiply times each other.

A more specific arrangement is shown in FIG. 15, where the fixed band and sliding band circuits, such as those described in connection with FIGS. 5 through 9, are located in the side path of series Type I dual path compressors and expanders in a compander system (of the type generally described in U.S. Pat. No. 3,846,719). The arrangement has a fixed band compressor 138 in which the input signal is applied to the fixed band stage 140 and to the main path 142. The output of stage 140 is then added to the main path signal components in summing means 144 to provide the fixed band compressor output for application to the sliding band compressor 146. The latter has a sliding band stage 148 and a main path 150, which both receive the output of the fixed band compressor. The output of stage 148 is added to the main path signal components in summing means 152 to provide the overall compressor output to a transmission channel. The side path signal components in each compressor boost the main path signal components causing compressor action. The transmission channel output is applied to the expander portion of the compander system, includng a complementary sliding band expander 154 in series with a complementary fixed band expander 156. Expander 154 has an input summing means 158 that receives the transmission channel output and subtracts the output of the sliding band stage 148. Expander 156 likewise has an input summing means 160 that receive the output of the sliding band expander 154 and subtracts the output of fixed band stage 140. The side path signal components thus buck the main path signal components causing expander action. Note that the series order of the expanders is complementary to the order of the compressors.

In FIG. 16, a Type II dual path compander arrangement (of the type generally described in U.S. Pat. No. 3,903,485) is shown, also employing fixed band and sliding band circuits, such as those described in connection with FIGS. 5 through 9, in the side paths series. The arrangement has a fixed bad compressor 162 in which the input signal is applied to an input summing means 164 that also receives the output of the fixed band stage 140 and combines the applied signal components. The summing means 164 has its output applied to the main path 166 which provides the fixed band compressor output to the sliding band compressor 168. The latter has an input summing means 170 which combines the output of compressor 162 with the output of the sliding band stage 148. The suming means 170 has its output applied to the main path 172 which provides the input to the sliding band stage 148 and the overall compressor output to the transmission channel. The side path signal components in each compressor boost the main path signal components causing compressor action. The transmission channel output is applied to the expander portion of the compander system, including a complementary sliding band expander 174 in series with a complementary fixed band expander 178. The input to expander 174 is applied to the sliding band stage 148 and the main path 176. The output of sliding band stage 148 is subtracted from the main path in summing means 177 which provides the output to the fixed band expander 178. The input to expander 178 is applied to fixed band stage 140 and to the main path 180. The output of the fixed band stage 140 is subtracted from the main path in summing means 182 to provide the overall system output. The side path signal component buck the main path signal components causing expander action. Note that the series order of the expanders is also complementary to the order of the compressors in this arrangement.

As mentioned above, a very useful arrangement is to provide a compressor or expander configured in the nature of bandsplitting high frequency and low frequency bands, each band made up of series sliding band and fixed band stages of the type described in connection with FIGS. 5 through 9. The series high frequency and low frequency stages are arranged in two parallel paths that can operate as stand alone dynamic range modification devices or as side paths in Type I or Type II dual path arrangements such as described in U.S. Pat. Nos. 3,846,719; 3,903,485; Re U.S. Pat. No. 28,426; and U.S. Pat. No. 4,490,691. Preferably, single pole filters with the same corner frequency in each are employed so that the combined quiescent response of the stages is flat. An advantageous corner frequency for the high and low frequency stages is about 800 Hz for an audio system. With the gently sloping 6 dB/octave slope of the filters, if the high frequency stages have a corner frequency of 800 Hz, significant action as low as 100 or 200 Hz is provided. If the low frequency stage also has a corner frequency of 800 Hz, significant action as high as 6 kHz to 8 kHz is provided. Thus, for signals lying in the range of, say 200 Hz to 6 Hz, which is the band having most of the energy in typical music, the high and low frequency stages are effective and provide a signal tracking effect. For example, as explained further below, for a single dominant signal in that range, the overall response is that of two sliding bands, above and below the dominant signal. For more than one dominant signal the response is a fixed band between the most upper and most lower dominant signals and sliding band responses above and below the most upper and most lower dominant signals, respectively.

FIG. 17 shows a bandsplitting arrangement of the type just described. The sliding band stages may be implemented using any of the circuits discussed above. The same corner frequency preferably is used for all of the fixed band and sliding band stages (the quiescent corner frequency in the case of the sliding band stages). The high frequency sliding band stages should operate such that their corner frequency slides upward from the quiescent frequency as signal levels rise. The low frequency sliding band stages should operate such that their corner frequency slides downward from the quiescent frequency as signal levels rise. FIG. 17 has a compressor 184 in which the input signal is applied to a main path 186 and to two parallel side paths: a high frequency side path having in series a high frequency fixed band stage 188 and a high frequency sliding band stage 190; and a low frequency side path having a low frequency fixed band stage 192 and a low frequency sliding band stage 194. The outputs of the two side paths are combined in summing means 196 and then added to the main path signal components in summing means 198 to provide the compressor output for application to a transmission channel. The side path signal components thus boost the main path signal components causing compressor action. The transmission channel output is applied to the expander 200, configured in a complmentary manner to the compressor 184, which has an input combining means 202 which receives the transmission channel output and subtracts therefrom the sum of the high frequency and low frequency side paths. Combining means 202 feeds the main path 204 from which the overall system output is taken and the side path inputs are taken to the series high frequency fixed band and sliding band stages 188 and 190 and to the series low frequency fixed band and sliding band stages 192 and 194. The side path outputs are combine in summing means 206 before application to the input combining means 202. The side path signal components buck the main path signal components causing expander action. Although the arrangement of FIG. 17 is shown as a Type I compander, a Type II configuration may also be used.

In FIGS. 11 through 17 the main path of each compressor and expander is linear with respect to dynamic range and the level of the sum or the side path stages is generally less than the maximum level of the main path. The transmission channel in those FIGS. may include any type of storage or transmission medium and may also include means for converting or encoding the analog signal components from the compressor into a different form (digital, for example), the storage or transmission of the encoded signals, and means for reconverting or decoding the encoded signals back into analog signal components. The order of the series fixed band and sliding band compressors may be as shown in FIGS. 14 through 17; or, alternatively, the sliding band compressor may be located upstream of the fixed band compressor. For complementarity, the expander circuits are arranged in reverse order to the arrangement of the compressor circuit in the arrangements of FIGS. 14 through 17. So that the effects of the series connected compressor elements occur in substantially the same dynamic region, the control amplifier gains should be lowered and/or the thresholds of the downstream elements should be raised in order to compensate for the signal gains produced by the upstream elements. In the expander portion of the system, the control amplifier gains should be raised and/or the thresholds of the upstream elements should be lowered.

FIG. 18 is a representation of the quiescent characteristics of the compressor 102 of the arrangement of FIG. 13 and of the compressor 184 of the arrangement of FIG. 17. A common corner frequency of 800 Hz for all four stages is assumed. The curves also illustrate the substantial overlap of the 6 dB/octave skirts of the single pole filters.

I claim:

1. A circuit for modifying the dynamic range of an input signal, comprising
    variable gain circuit means,
    variable pass filter circuit means, said variable pass filter circuit means providing a boost or cut in a high or low frequency region of the signal band, and responsive to signals in that region to cause the filter means corner frequency to slide in the sense narrowing the boosted or cut region,
    means for connecting said circuit means in parallel,
    means for coupling the input signal to the parallel arrangement of said circuit means, and
    means for deriving an output signal from the parallel arrangement of said circuit means.

2. A circuit according to claim 1 wherein at least one of said circuit means operates in a restricted frequency band, the circuit means operating within at least a substantially overlapping frequency range during quiescent conditions.

3. A circuit according to claim 1, wherein said variable gain circuit means includes fist and second variable gain circuits, each having a band defining filter, the filters having a substantially indentical cutoff frequency, the band defining filter included with said first variable gain circuit defining a band in the lower portion of the frequency spectrum of the input signal and the band defining filter included with said second variable gain circuit defining a band in the upper portion of the frequency spectrum of the input signal, and wherein said variable pass filter circuit means includes first and second variable pass filter circuits, the quiescent filter characteristic of said first variable pass filter circuit defining a band substantially the same as that defined by the band defining filter of said first variable gain circuit, the quiescent filter characteristic of said second variable pass filter circuit defining a band substantially the same as that defined by the band defining filter of said second variable gain circuit, the first variable pass filter circuit having a cutoff frequency that shifts downward in frequency, and the second variable pass filter circuit having a cutoff frequency that shifts upward in frequency.

4. A circuit according to claim 1, 2, or 3 herein the parallel arrangement of the variable gain circuit means and the variable pass filter circuit means is included in the further path of a dual path circuit, the combination comprising a main path which is linear with respect to dynamic range, a combining circuit in the main path, and said further path which includes said parallel arrangement of circuit means, the further path having its input coupled to the input or output of the main path and its output coupled to the combining circuit, the further path providing a signal which, at least in a part of the frequency band, boosts or bucks the main path signal, by way of the combining circuit, for dynamic range compression or expansion, respectively.

5. A circuit for modifying the dynamic range of input signal components within a frequency band, comprising
two circuit elements, each having its own characteristic action represented by the voltage transfer functions $t_1(s)$ and $t_2(s)$, respectively, wherein one of the transfer function represents a variable gain characteristic and the other transfer function represents a variable pass filter characteristic which provides a boost or cut in a high or low frequency region of the signal band, and responsive to signals in that region to cause the filter means corner frequency to slide in the sense narrowing the boosted or cut region, the characteristic actions operating at least partially within substantially the same frequency and level region, and
means for interconnecting the circuit elements such that when input signal components are applied, represented by the voltage $V_{in}$, the output voltage $V_{out}$ represented by $$V_{out} = V_{in}[t_1(s) + t_2(s)].$$

6. A circuit according to claim 5 wherein the two circuit elements are included in the further path of a dual path circuit, the combination comprising a main path which is linear with respect to dynamic range, a combining circuit in the main path, and said further path which includes said circuit elements, the further path having its input coupled to the input or output of the main path and its output coupled to the combining circuit, the further path providing a signal which, at least in a part of the frequency band, boosts or bucks the main path signal, by way of the combining circuit, for dynamic range compression or expansion, respectively.

7. A circuit for modifying the dynamic range of an input signal, comprising
first and second variable gain circuit means, each having a band defining filter, the filters having a substantially identical cutoff frequency, the band defining filter included with said first variable gain circuit means defining a band in the lower portion of the frequency spectrum of the input signal and the band defining filter included with said second variable gain circuit means defining a band in the upper portion of the frequency spectrum of the input signal,
first and second variable pass filter circuit means, the quiescent filter characteristic of said first variable pass filter circuit means defining a band substantially the same as that defined by the band defining filter of said first variable gain circuit means, the quiescent filter characteristic of said second variable pass filter circuit means defining a band substantially the same as that defined by the band defining filter of said second variable gain circuit means, the first variable pass filter circuit means having a cutoff frequency that shifts downward in frequency, and the second variable pass filter circuit means having a cutoff frequency that shifts upward in frequency,
means for connecting said first variable gain circuit means and said first variable pass filter circuit means in series,
means for connecting said second variable gain circuit means and said second variable pass filter circuit means in series,
means for connecting in parallel the series connection of said first variable gain circuit means and said first variable pass filter circuit means and the series connection of said second variable gain circuit means and said second variable pass filter circuit means,
means for coupling the input signal to the parallel arrangement of the two series circuit means, and
means for deriving an output signal from the parallel arrangement of the two series circuit means.

8. A circuit according to claim 7 wherein the parallel arrangement of the two series circuit means is included in the further path of a dual path circuit, the combination comprising a main path which is linear with respect to dynamic range, a combining circuit in the main path, and said further path which includes said parallel arrangement of the two series circuit means, the further path having its input coupled to the input or output of the main path and its output coupled to the combining circuit, the further path providing a signal which, at least in a part of the frequency band, boosts or bucks the main path signal, by way of the combining circuit, for dynamic range compression or expansion, respectively.

9. A circuit for modifying the dynamic range of an input signal, comprising
a main path which is linear with respect to dynamic range, a combining circuit in the main path, and a further path, which has its input coupled to the input or output of the main path and its output coupled to the combining circuit, the further path providing a signal which, at least in a part of the frequency band, boosts or bucks the main path signal, by way of the combining circuit, for dynamic range compression or expansion, respectively, said further path including variable gain circuit means, variable pass filter circuit means, said variable pass filter circuit means providing a boost or cut in a high or low frequency region of the frequency band, and responsive to signals in that region to cause the filter means corner frequency to slide in the sense narrowing the boosted or cut region, and means for connecting said circuit means in series in said further path.

10. A circuit for modifying the dynamic range of an input signal, comprising a main path which is linear with respect to dynamic range, a combining circuit in the main path, and a further path, which has its input coupled to the input or output of the main path and its output coupled to the combining circuit, the further path providing a signal which, at least in a part of the frequency band, boosts or bucks the main path signal, by way of the combining circuit, for dynamic range compression or expansion, respectively, said further path including two circuit elements, each having its own characteristic action represented by the voltage transfer functions $t_1(s)$ and $t_2(s)$, respectively, wherein one of the transfer function represents a variable gain characteristic and the other transfer function represents a variable pass filter characteristic, said variable pass filter characteristic providing a boost or cut in a high or low frequency region of the frequency band, and responsive to signals in that region to cause the filter characteristic corner frequency to slide in the sense narrowing the boosted or cut region, the characteristic actions operating at least partially within substantially the same frequency and level region, and means for interconnecting the circuit elements in the further path such that when input signal components are applied to the circuit elements, represented by the voltage $V_{in}$, the output voltage $V_{out}$ from the circuit elements is represented by $$V_{out} = V_{in}[t_1(s)t_2(s)].$$

* * * * *

UNITED STATES PATENT AND TRADEMARK OFFICE
CERTIFICATE OF CORRECTION

PATENT NO. : 4,701,722
DATED : Oct. 20, 1987
INVENTOR(S) : Dolby

It is certified that error appears in the above-identified patent and that said Letters Patent is hereby corrected as shown below:

Column 15:
   line 2:   "fist" should be --first--;
   line 4:   "indentical" should be --identical--;
   line 23: "claim" should be --claims" and
             "herein" should be --wherein--; and
   line 55: insert --is-- before "represented".

Signed and Sealed this

Ninth Day of August, 1988

Attest:

DONALD J. QUIGG

Attesting Officer        Commissioner of Patents and Trademarks